United States Patent [19]
Wong

[11] Patent Number: 5,528,205
[45] Date of Patent: Jun. 18, 1996

[54] INTEGRATED ELECTROMAGNETIC INTERFERENCE FILTER

[75] Inventor: Suinin W. Wong, Fremont, Calif.

[73] Assignee: Apple Computer, Inc., Cupertino, Calif.

[21] Appl. No.: 221,307

[22] Filed: Mar. 30, 1994

[51] Int. Cl.$^6$ .................................................. H03H 7/00
[52] U.S. Cl. .......................... 333/177; 336/175; 336/219; 336/221; 333/12
[58] Field of Search ................................. 333/177–181, 333/12; 336/219, 175, 221

[56] References Cited

U.S. PATENT DOCUMENTS

| | | | |
|---|---|---|---|
| 5,083,101 | 1/1992 | Frederick | 333/181 |
| 5,119,059 | 6/1992 | Coui et al. | 336/175 |
| 5,243,308 | 9/1993 | Shusterman et al. | 333/181 |
| 5,245,521 | 9/1993 | Spreen | 336/175 |
| 5,313,176 | 5/1994 | Upadhyay | 333/181 |
| 5,321,373 | 6/1994 | Shusterman et al. | 333/181 |

FOREIGN PATENT DOCUMENTS 0331188  1/1980  Japan ..................................... 336/221

OTHER PUBLICATIONS

IBM Technical Disclosure Bulletin, "Power Line Filter" Sekhri, S. J., vol. 17 No. 7 Dec. 74 pp. 1998–1999.

Primary Examiner—Robert Pascal
Assistant Examiner—Darius Gambino
Attorney, Agent, or Firm—Richard C. Liu

[57] ABSTRACT

An integrated and drop-in EMI filter that features common-mode and differential-mode noise filtering capabilities is disclosed. The common-mode portion and the differential-mode portion of the filter are independent of each other in that the two filter portions may be made out of different ferrites, also in that, the an increase in the filtering capability in one mode, such as having an increased number of turns in the winding, would not affect or reduce the filtering capability of the other mode, such as reducing the overall throughhole depths a conductor travels.

8 Claims, 5 Drawing Sheets

INTEGRATED ELECTROMAGNETIC INTERFERENCE FILTER

BACKGROUND OF THE INVENTION

1. Field of the Invention

This invention relates generally to components for reducing electromagnetic interference and, more particularly to an integrated filter featuring differential-mode and common-mode noise filtering capabilities.

2. Description of the Related Art

Electromagnetic interference (EMI) or electrical noise disrupts the normal operation of electronic equipment such as power supplies, electromechanical devices and computer systems. For a computer system, such an electromagnetic disruption may be caused by its external cabling, power supplies, electronic components, signal transmission paths, printed circuit boards and the like. Such a disruption may even be caused by its external environment because an electronic device that radiates electrical noise is also susceptible to electrical noises from other sources. In addition, the Federal Communications Commission (FCC) had imposed legal limits on the strength of radiated and conducted EMI that may be generated by devices that use timing circuits operating at frequencies above 9 kilohertz. Therefore, when designing an electronic equipment, it is desirable for EMI or electrical noise be kept at a minimum.

Electrical noise propagates either via air by electromagnetic fields or via conducting paths by currents. When electrical noise propagates via the conducting paths, there are two modal paths by which it travels, namely, the common-mode and the differential-mode. In general, the distinction between the two noise modes could be understood as follows: When a pair of parallel conductors connects two electronic circuit blocks together, the conductors would typically carry current signals. Each of the two current signals could be viewed equivalently as having two current components, a differential-mode current component and a common-mode current component. The two differential-mode current components in the pair of conductors are oppositely directed and typically contain the desirable portion of the propagating signal. On the other hand, the two common-mode current components on the conductors are directed in the same direction. And, these common-mode currents typically contain the undesirable portion of the propagating signal; but, unfortunately, in practice, they are always present.

In order to reduce common-mode currents, conductors are typically wound around a ferromagnetic core such as a ferrite toroid inductor. The electromagnetic fluxes resulting from the combination of the common-mode currents and the ferromagnetic core create an impedance that in turn reduces the amplitude of the common-mode currents. However, the conductor windings around the ferromagnetic core has no effect on the oppositely directed differential-mode currents because the resulting electromagnetic fluxes would have balanced each other out.

Since differential-mode currents often contain the desirable current signals, one then reduces the differential-mode electrical noise not by reducing overall current amplitudes but by eliminating the higher frequency harmonics of the current components and leaving the fundamental or the operating frequency element undisturbed. Ferromagnetic beads such as ferrite beads, typically of a cylindrical shape each having a co-axial bore, when used, will selectively attenuate (depending on the ferrite material selected) the high frequency components without affecting the lower frequency components of the signal. In practice, ferrite beads are placed in series with the signal conductors to suppress the differential-mode noise.

A typical EMI filter includes an input and output series transformers and a shunt transformer coupled to ground, this transformer combination being configured so that the overall effect is the attenuation of the common-mode electrical noise. The common-mode signal reacts to a high input impedance followed by a low impedance to ground, followed by a high impedance on the output side of the filter. The high impedance on the output side of the filtering component forms a voltage divider with the common-mode impedance on the wiring thus reducing the amplitude of the common-mode signal on the wiring. In contrast, according to this configuration, the differential-mode electrical noise is virtually unimpeded, reacting to virtually no input or output impedance contributed by the filter itself.

In another typical EMI filter, a generally rectangular magnetic core is configured to be mounted onto a printed circuit board by an automated insertion system. This component has pairs of throughholes and a number of U-shaped electrical conductors extending therethrough. Some of the U-shaped conductors in a throughhole share a common air space for impeding common-mode noise. Others, for the purpose of attenuating differential-mode noise, do not share any common air space with any other conductors in the throughholes.

Generally, such a filter configuration is limited in its EMI filtering effectiveness. Filters as such being compatible with automated insertion systems for mounting onto printed circuit boards typically do not provide optimal magnetic core depth for adequate EMI filtering. For example, for printed circuit board mounting purposes, magnetic core depth is fixed throughout the core, if the core depth is optimized for common-mode noise filtering, then regardless of what the differential-mode noise filtering requirements may be, one is forced to accept the already stipulated core depth. This filter which by itself is susceptible to external EMI noises, further loses its EMI filter effectiveness by being mounted on a printed circuit board which is often the high gradient area of an EMI noise environment such as the inside of a high speed personal computer enclosure. Furthermore, this filter's performance in its common-mode noise filtering is degraded further still because the U-shaped conductors extending through this filter are neither tightly couple or physically twisted together but placed in a spaced relation as required by the automated insertion systems.

Therefore, it is desirable to provide an integrated and economical electronic component that features effective common-mode as well as differential-mode EMI noise filtering.

SUMMARY OF THE INVENTION

An object of this invention is to provide an integrated EMI filter which features the common-mode as well as the differential-mode noise filtering capabilities.

Another object of this invention is to provide an integrated EMI filter which features sufficient ferromagnetic throughhole depths for adequate common-mode and differential-mode EMI filtering.

Another objective of this invention is to provide a drop-in EMI filter serving as a convenient component part for replacement and retrofitting purposes.

Yet another object of this invention is to provide an integrated EMI filter which is simple and economical to construct.

In accordance with these and other objects of the invention, an integrated EMI filter is provided for filtering common-mode and differential-mode electrical noise. This EMI filter combines two filters into one configuration. It is made out of a ferromagnetic material, preferably of ferrite, and of a unitary construction. Briefly, the invention comprises a ferrite core having a common mode filter portion which has a number of cut-away surfaces which in turn define a cut-away space region, and a differential-mode filter portion which has a plurality of throughholes extending through the ferrite core. The cut-away space region is configured to define a conductor winding portion of the ferrite core and to receive a number of electrical conductors in a physically coupled manner allowing them to wind about the conductor winding portion of the ferrite core whereby providing the ability to filter the common-mode electrical noise. The differential-mode filter portion with its throughholes is configured to allow the electrical conductors to pass through each throughhole singly whereby providing the ability to filter the differential-mode electrical noise. The common-mode filter portion and the differential-mode filter portion of the ferrite core are independent of each other in that the electrical conductors may selectively wind about the conductor winding portion or pass through the throughholes, and in that an increase in the filtering capability in one noise mode, such as having an increased number of turns in the windings, would not affect or reduce the filtering capability of the other mode, such as reducing the overall throughhole depth a conductor travels, moreover, in that the common-mode and the differential-mode portions of the ferrite core may be made out of different ferrite materials.

An advantage of this invention is that a simple and a drop-in EMI filter is disclosed featuring combined common-mode and differential-mode noise filtering capabilities. Another advantage is that the ferrite common-mode filter function of the present invention is independent of its differential-mode filter function.

These and objects and advantages of the present invention will no doubt become apparent upon a reading of the following descriptions and a study of the several figures of the drawing.

BRIEF DESCRIPTION OF THE DRAWING

The accompanying drawings, which are incorporated in and form a part of this specification, illustrate embodiments of the invention and, together with the description, serve to explain the principles of the invention.

DETAILED DESCRIPTION

Common-mode noise is an electromagnetic interference that occurs simultaneously on all lines of conductors with respect to a common ground whereas differential-mode noise is also an electromagnetic interference but occurring between conductors. In order to remove the common-mode noise, it is well known to configure a filter so to allow wrapping of lines of electrical conductors through a ferrite core. On the other hand, in order to remove the differential-mode noise, it is also well known to pass individual conductor lines through individual ferrite throughholes on a one-to-one basis. The present invention integrates the two noise filtering capabilities and provides a filter having a unitary construction.

Figure 1:
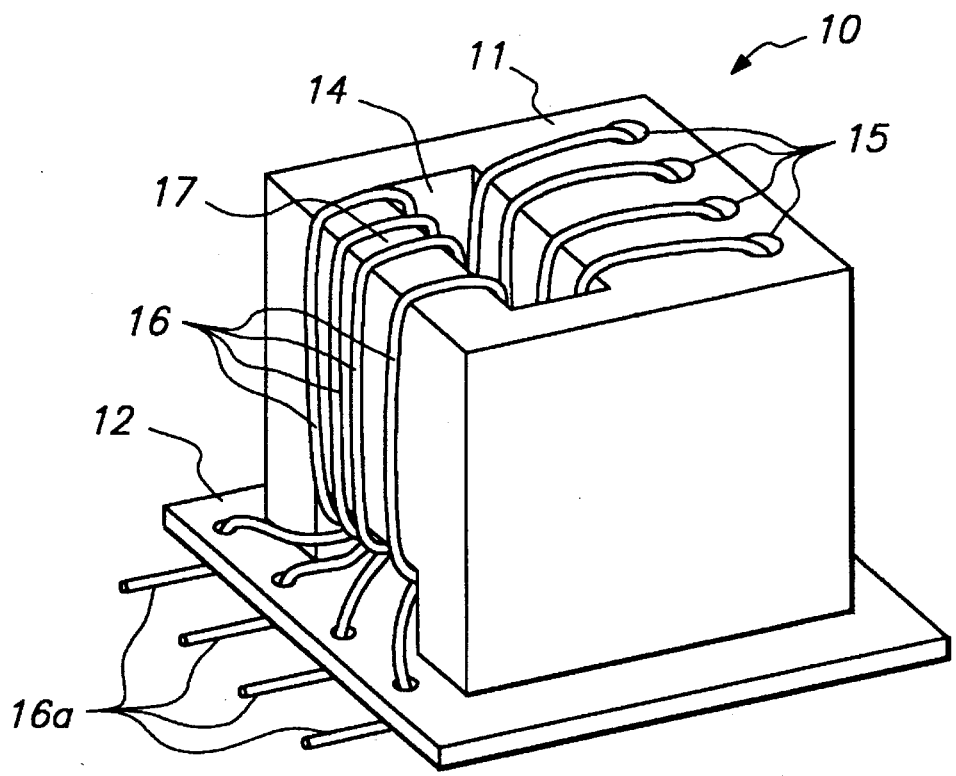
FIG. 1 is a perspective view of a ferrite filter embodying various aspects of the present invention.
Figure 1A:
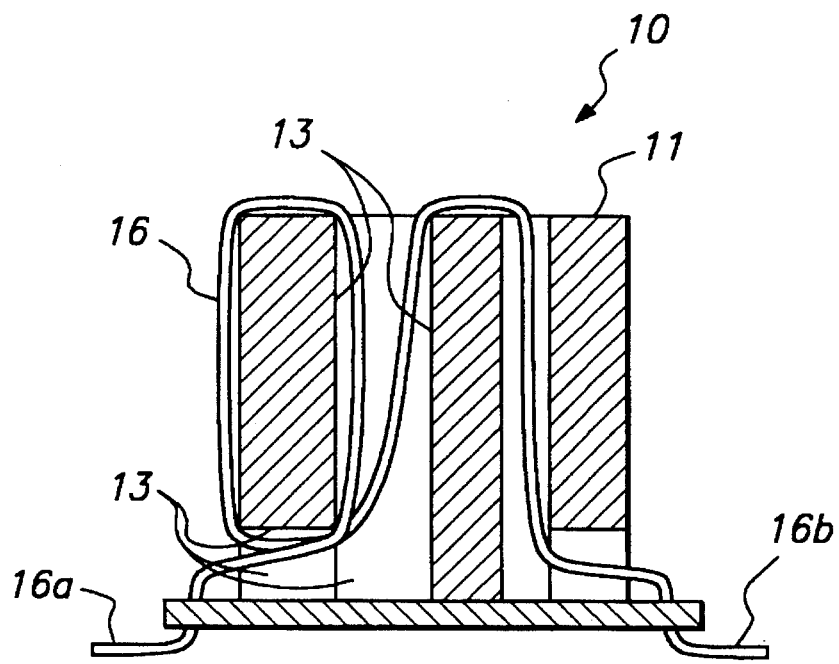
FIG. 1A is a cross-sectional of FIG. 1.

Referring to FIGS. 1 and 1A, there is shown a perspective view and its respective cross-sectional view of a electrical noise filter 10 in accordance with the present invention embodying common-mode and differential-mode filtering capabilities. The noise filter 10, being generally block-shaped, has a ferromagnetic core 11 and a non-conductive base 12, the base 12 preferably being made out of plastics and fastened to the ferromagnetic core 11. The core 11 includes a number of cut-away surfaces 13 defining a cut-away space region 14 and further includes a plurality of throughholes 15. The cut-away space region 14 is configured to define a winding portion 17 of the ferromagnetic core 11 and the throughholes 15 are configured to utilize the dimensions of the ferromagnetic core 11. A plurality of electrical conductors 16 collectively has two terminal ends 16a and 16b which are disposed near the non-conductive base 12 on either side of the ferromagnetic core 11 respectively. The conductors 16 wind about the winding portion 17 together once and individually pass through the throughholes 15 on a one-to-one basis.

Ferrite is a preferred ferromagnetic material for the ferromagnetic core 11 construction. Ferrite itself is a composite material and preferably be manganese zinc, nickel zinc, or any other suitable material to be most effective for a desired range of frequencies. At times, it may be of interest for the common-mode filter be effective at a frequency range different from that of the differential-mode filter. Therefore, it may be preferred to integrate ferrites of different composite contents into one filter configuration. Because the material described is highly conductive, the electrical conductors or wires should be insulated from the ferrite core. Such insulation can be effected preferably by coating the ferrite core with an electrically insulating material, coating the conductors or wires with an electrically insulating material or both. On the other hand, there are types of ferrites where their resistivities are sufficiently high, then in those instances, conductors without insulation may be safely used.

In operation, still referring to FIGS. 1 and 1A, the plurality of electrical conductors 16 are passed through the cut-away space region 14 and wound about the winding portion 17 once whereby providing the common-mode noise filtering capability. The same electrical conductors 16 are passed through the throughholes 15 individually on a one-to-one basis whereby providing the differential-mode noise capability. There is no preference as to which mode of filtering should come first for the conductors, therefore, in that sense, this noise filter 10 is order-independent.

Once the ferrite material is selected for the noise filter 10, the differential-mode filter performance can be improved by configuring the throughholes 15 with an inner diameter most closely matching the outer diameter of the electrical conductors 16 to be filtered. Furthermore, for improving the common-mode filter performance, close physical coupling for windings resulting in dose magnetic coupling is preferred. If two electrical conductors are only loosely wound together, the performance of the present invention will be significantly degraded. Close coupling can be effected by physically tightening, twisting or fastening the conductors together. However, only for the purpose of clarity, the conductors in the FIGURES of the Drawing are shown to be loosely wound and physically apart from each other.

It is worthwhile to note that the noise filter 10 is configured in such a way that the common-mode filtering and the differential-mode filtering functions are independent of each other in that the conductors 16 may bypass the cut-away space region 14 if common-mode filtering is not needed. Similarly, the conductors could also bypass the throughholes 15 if differential-mode filtering is not called for. Moreover, modern EMI design techniques cannot accurately predict the level of EMI that would be radiated by an arbitrary equipment and cable configuration. In addition, time-to-market pressures and subsequent hardware upgrades often require revision in cable designs to satisfy all system performance and EMI requirements. Therefore, with respect to replacement and retrofit, the two filtering functions are independent in that an increase in the filtering capability in one noise mode, such as having an increased number of turns in the winding, would not affect or reduce the filtering capability of the other mode, such as reducing the overall throughhole depths a conductor travels.

Figure 2:
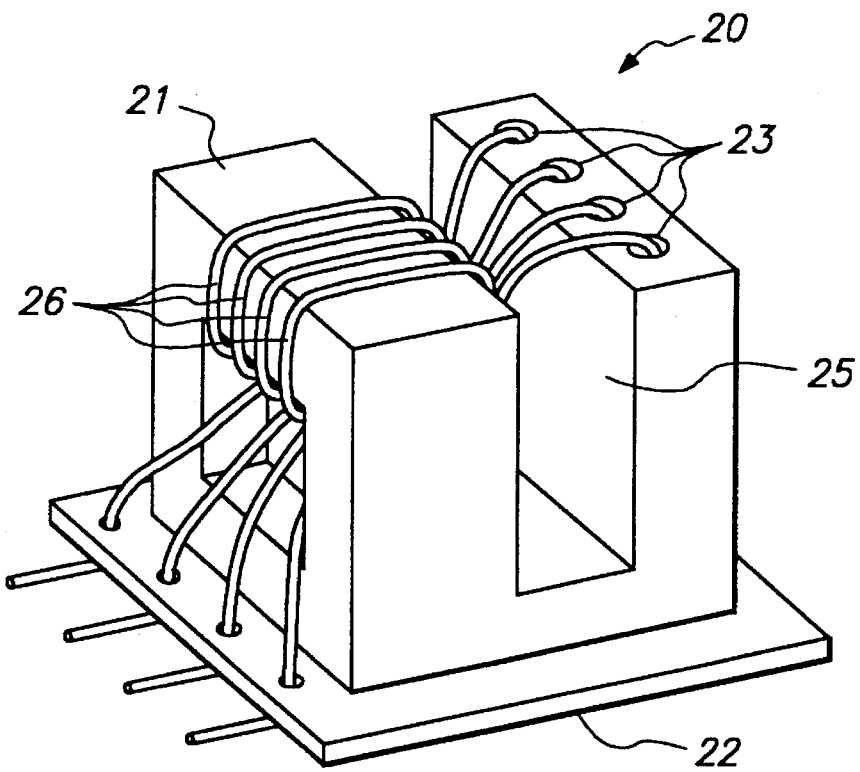
FIG. 2 is a perspective view of another embodiment in accordance with the present invention.
Figure 2A:
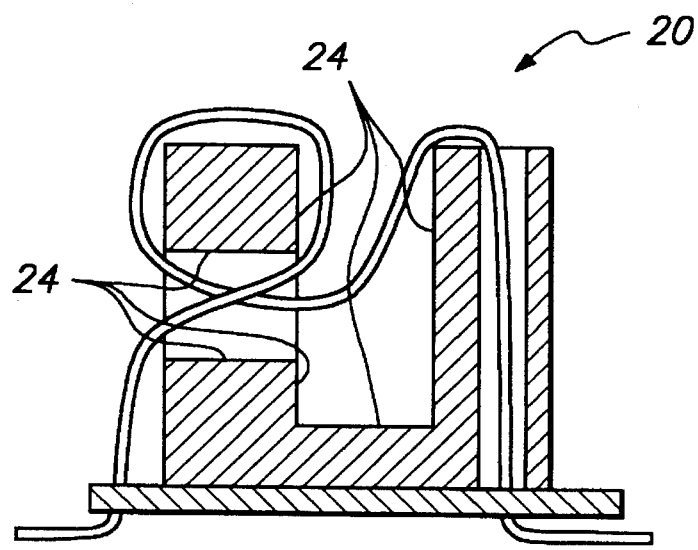
FIG. 2A is a cross-sectional view of FIG. 2.

It is well understood that factors influencing the effective distance conductors experience in windings relate nonlinearly but directly to a filter's ability to remove common-mode noise, for example, the thickness of winding cores relates directly to filter performance. The longer the effective distance, the better is the common-mode filter performance for a given EMI noise environment, conversely, the shorter the effective distance, less effective the performance for that given noise environment, but it may be wholly adequate for another EMI noise environment. To demonstrate a configuration having a reduced winding portion thickness, referring now to FIGS. 2 and 2A, here are shown another embodiment according to the present invention and its associated cross-sectional view. FIGS. 2 and 2A show a noise filter 20 that comprises a ferromagnetic core 21 and having fastened thereto a non-conductive base 22. The ferromagnetic core 21 includes a plurality of throughholes 23 and a plurality of cut-away surfaces 24 of the ferromagnetic core 21, the surfaces 24 defining a cut-away space region 25 and in turn defining a winding portion 26 of the ferromagnetic core 21 having a reduced thickness than that of the winding portion 17 in FIGS. 1 and 1A.

Figure 3:
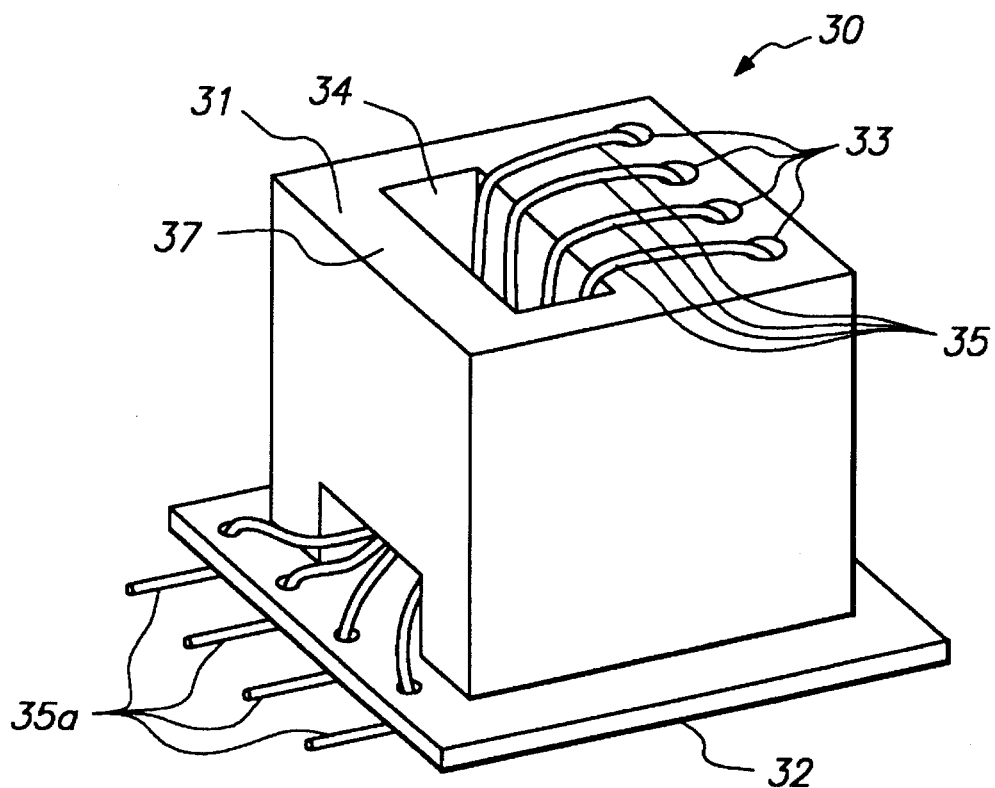
FIG. 3 is a perspective view of yet another embodiment in accordance with the present invention.
Figure 3A:
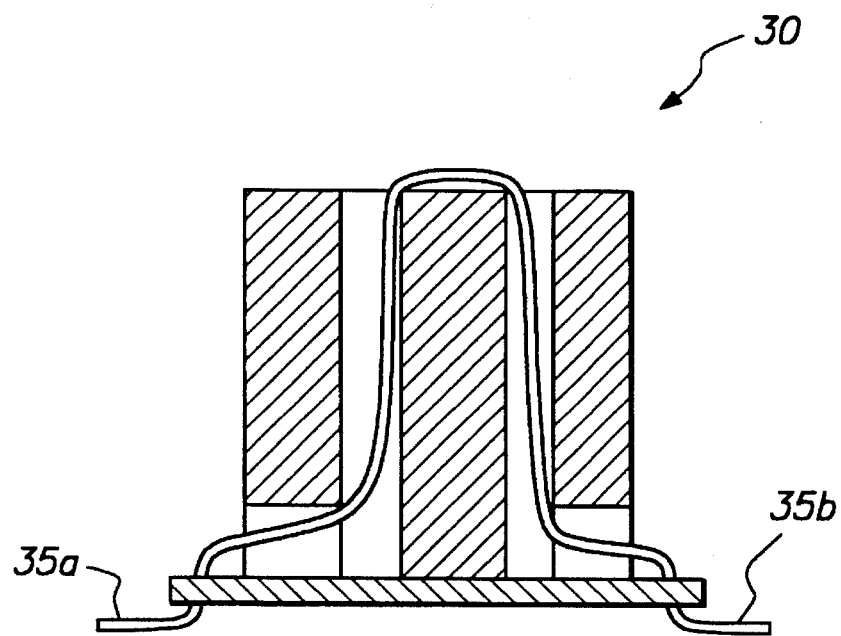
FIG. 3A is a cross-sectional view of FIG. 3.
Figure 4:
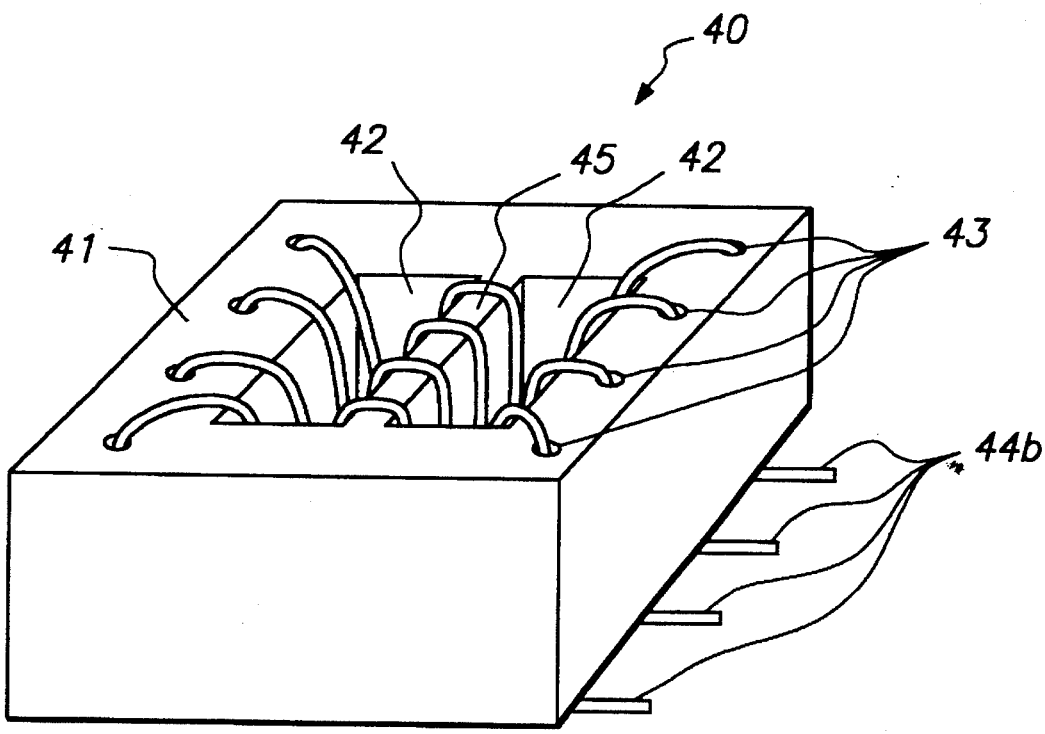
FIG. 4 is a perspective view of still another embodiment in accordance with the present invention.
Figure 4A:
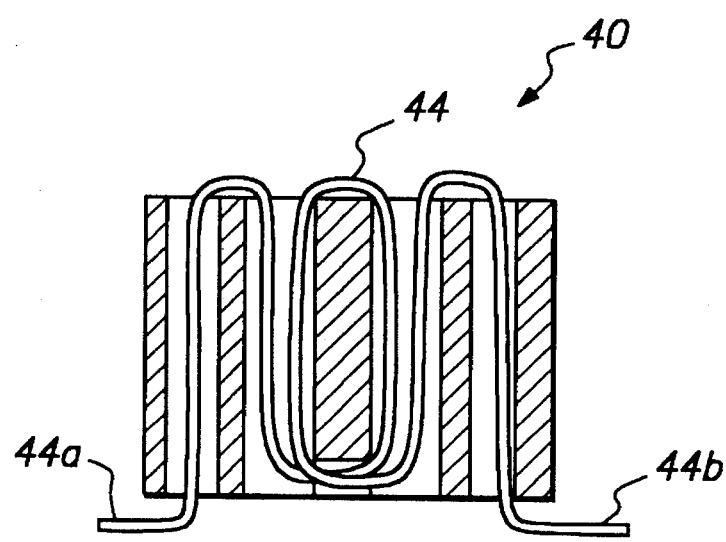
FIG. 4A is a cross-sectional view of FIG. 4.

Another factor that influences the effective distance conductors experience in windings is the number of winding turns, for example, adding winding turns is equivalent to providing longer effective distance. However, since inter-winding capacitance will increase along with the number of added turns, it is preferred that a maximum of three conductor turns be wound on a single unit. Increasing the number of turns beyond three will tend to degrade performance at higher frequencies where inter-winding capacitance dominates the characteristics of the filter. On the other hand, at times, a common-mode filter with zero winding turn is adequate for a given noise environment. To demonstrate a zero-turn configuration, referring now to FIGS. 3 and 3A, here are shown another embodiment according to the present invention and its associated cross-sectional view. FIGS. 3 and 3A show a noise filter 30 of similar construct to the noise filter 10, the noise filter 30 having a ferromagnetic core 31 and a non-conductive base 32 fastened thereto. The ferromagnetic core includes a plurality of throughholes 33 and a cut-away space region 34 which defines a winding portion 37 of the ferromagnetic core 31. A plurality of electrical conductors 35 collectively has two terminal ends 35a and 35b being disposed near the non-conductive base 32 on two sides of the core 31 respectively and the conductors 35 pass through the cutaway space region 34 without winding about the winding portion 37.

Figure 5:
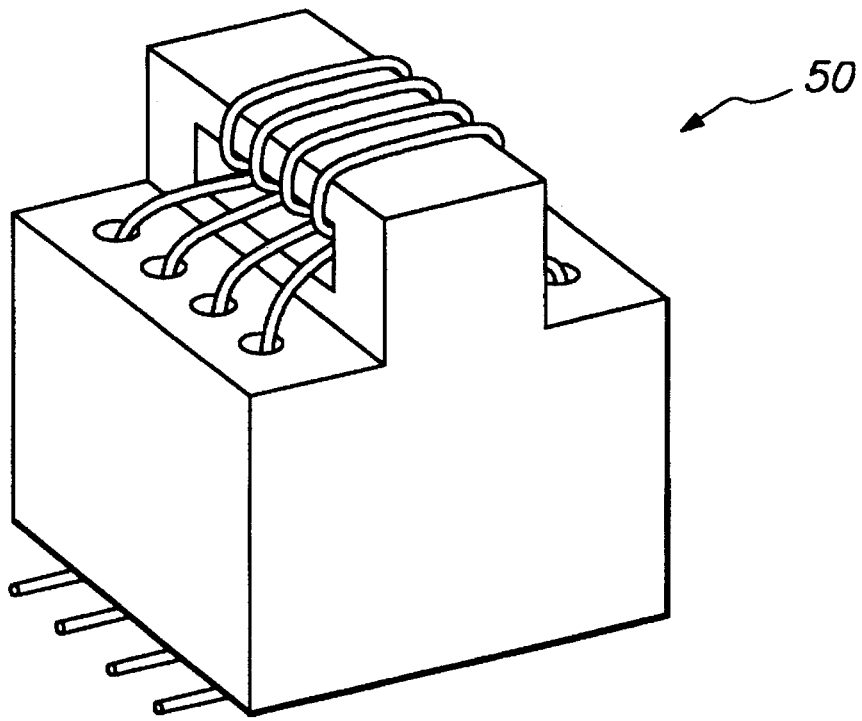
FIG. 5 is a perspective view of one more embodiment in accordance with the present invention.
Figure 5A:
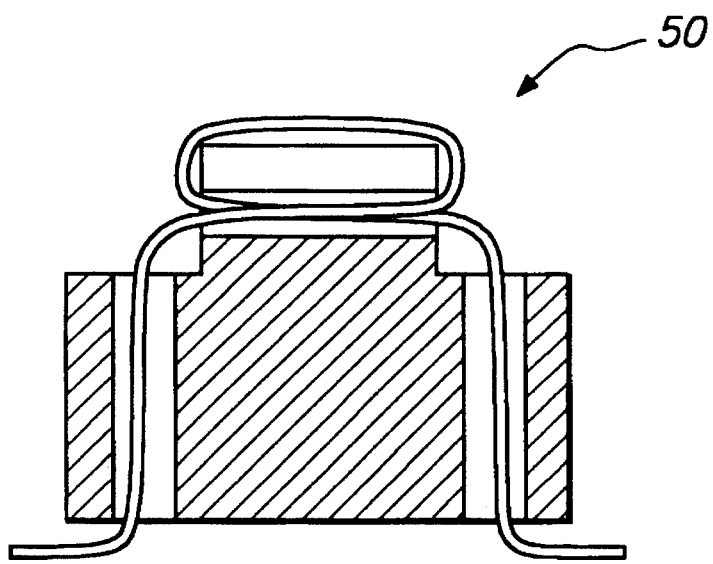
FIG. 5A is a cross-sectional of FIG. 5.

Referring now to FIGS. 4, 4A, 5 and 5A, there are shown two embodiments and their respective sectional views in accordance with the present invention. A noise filter 40 includes a ferrite core 41 having a cut-away space region 42 centrally located whereby defining a winding portion 45 of the ferrite core 41 and a plurality of throughholes 43 disposed on either side of the cut-away space region 42. A plurality of electrical conductors 44 collectively having two terminal ends 44a and 44b disposed near the underside of the ferrite core 41, first individually passes through one of the throughholes 43, then collectively wind about the winding portion 45 before again individually pass through another of the throughholes 43. The noise filter 50 of FIGS. 5 and 5A is of similar construct and therefore will not be further described.

The noise filters 40 and 50 are electrically insulated from the respective conductors, such insulation preferably be effected by coating the core with an insulating material such as a thirty micron coating of poly-p-xylylene. Any suitable epoxy may also be used to insulate the conductors from the core. Such configurations could be positioned almost anywhere within an EMI noise environment for optimal performance. They could also conveniently serve as drop-in replacement parts or retrofitting parts to electronic components such as cable assemblies inside an enclosure, for example, cables for central processor units, monitors, keyboards, printers, and other peripheral equipment or such as cable assemblies outside the enclosure where the long external power and data cables act as efficient antennas to transmit internally generated noise outside of the equipment's enclosure.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An integrated EMI filter for filtering common-mode and differential-mode electrical noises as carried by a plurality of conductors, the filter comprises:

a ferrite core having a common-mode portion and a differential-mode portion, wherein the common-mode portion includes a plurality of cut-away surfaces defining a contiguous cut-away space region wherein the cut-away space region is defined to allow at least two physically coupled conductors to wind about a winding portion of the ferrite core whereby filtering the common-mode electrical noise, and wherein the differential-mode portion defines a plurality of throughholes configured such that each of the at least two conductors is received into and extruded out of a throughhole singly whereby filtering the differential-mode electrical noise; and said differential-mode portion and the common-mode portion being configured to provide independence between the differential and common noise filtering functions in that an increase in the filtering capability in one noise filtering function, such as the differential noise filtering function, would not reduce the filtering capability of another noise filtering function, such as the common noise filtering function.

2. The integrated EMI filter of claim 1 wherein the ferrite core is unitary in configuration and generally block-shaped.

3. The integrated EMI filter of claim 1 wherein the common-mode portion and the differential-mode portion are made out of different ferrites.

4. The integrated EMI filter of claim 1 further comprises a non-conductive base fastened to one side of the ferrite core.

5. The integrated EMI filter of claim 4 wherein the ferrite core is coated with a layer of non-conductive chemical coating.

6. The integrated EMI filter of claim 1 wherein the ferrite core allows the plurality of conductors be selectively filtered.

7. The integrated EMI filter of claim 1 wherein the plurality of conductors are insulated.

8. An integrated EMI filter for filtering common-mode and differential-mode electrical noises as carried by a plurality of conductors, the filter comprises:

a ferromagnetic core having a common-mode portion and a differential-mode portion, wherein the common-mode portion includes a plurality of cut-away surfaces defining a cut-away space region wherein the cut-away space region is defined to allow at least two physically coupled conductors to wind about at least one winding portion of the ferromagnetic core whereby filtering the common-mode electrical noise, wherein the differential-mode portion defines a plurality of throughholes configured such that each of at least two conductors is received into and extruded out of at least one throughhole singly whereby filtering the differential-mode electrical noise wherein the ferromagnetic core is configured to allow the plurality of conductors be selectively filtered; and said differential-mode portion and the common-mode portion being configured to provide independence between the differential and common noise filtering functions in that an increase in the filtering capability in one noise filtering function, such as the common noise filtering function, would not reduce the filtering capability of another noise filtering function, such as the differential noise filtering function.

* * * * *